United States Patent [19]
Urushiwara et al.

[11] Patent Number: 5,581,131
[45] Date of Patent: Dec. 3, 1996

[54] ELECTRONIC DISTRIBUTOR IGNITION DEVICE FOR INTERNAL COMBUSTION ENGINES

[75] Inventors: Noriyoshi Urushiwara, Katsuta; Noboru Sugiura, Mito, both of Japan

[73] Assignee: Hitachi, Ltd., Japan

[21] Appl. No.: 5,354

[22] Filed: Jan. 19, 1993

[30] Foreign Application Priority Data

Jan. 17, 1992 [JP] Japan .................... 4-006632

[51] Int. Cl.⁶ ......................... F02P 17/00
[52] U.S. Cl. ............. 307/10.6; 307/10.1; 123/630; 361/118
[58] Field of Search ................... 123/630, 644; 307/9.1–10.8; 361/118, 56, 247, 253, 263

[56] References Cited

U.S. PATENT DOCUMENTS

| | | | |
|---|---|---|---|
| 3,671,851 | 6/1972 | Harkness | 123/630 |
| 4,064,415 | 12/1977 | Blackington | 123/630 |
| 5,060,623 | 10/1991 | McCoxy | 123/644 |
| 5,127,388 | 7/1992 | Cicalese et al. | 123/644 |
| 5,299,543 | 5/1994 | Taruya et al. | 123/644 |

FOREIGN PATENT DOCUMENTS 63-93471  6/1988  Japan .

*Primary Examiner*—William M. Shoop, Jr.
*Assistant Examiner*—Peter Ganjoo
*Attorney, Agent, or Firm*—Evenson, McKeown, Edwards & Lenahan P.L.L.C.

[57] ABSTRACT

A switching circuit for an electronic distributor ignition device for an internal combustion engine. Current flowing through the primary ignition coil is controlled by a semiconductor switch circuit connected between the coil and ground. A control input to the semiconductor switch is also connected to ground by a pair of oppositely poled zener diodes which have a temperature coefficient which approximates that of the semiconductor switch circuit.

23 Claims, 7 Drawing Sheets

ELECTRONIC DISTRIBUTOR IGNITION DEVICE FOR INTERNAL COMBUSTION ENGINES

BACKGROUND OF THE INVENTION

The present invention relates to an electronic distributor ignition device for an internal combustion engine, especially an electronic distributor ignition device which controls changes of current limiting values.

In conventional electronic ignition devices, such as described in Laid-Open Japanese Patent No. 93471/1988, the maximum permissible primary current in the ignition coil is detected by reference to the voltage across the resistance of the hybrid IC conductor, which is divided in a voltage divider connected in parallel to the hybrid IC conductor, and is used to drive the current control transistor. In addition, a feedback circuit is used to extract current from the base of the power transistor.

One disadvantage of such prior art systems is that when the ambient temperature changes by as much as 100° C., the current limiting value can also change by more than 30%, depending on the temperature characteristics of the emitter resistor and on the $V_{BE}$ of the current control transistor. It is therefore necessary to limit the current in order to protect the power switching element from damage caused by excessive current. If this current limiting value is set low, then the secondary voltage output from the ignition coil also drops, degrading the performance of the internal combustion engine. In addition, the amount of heat generated by the power transistor increases, as well. Thus, variation of the current limiting value should be kept small.

In the prior art, a feedback circuit is used, and as a result the power transistor is apt to oscillate, increasing the rate at which it generates heat, which is a problem. To eliminate this problem, a condenser must be inserted between the base of the power transistor and the base of the current limiting transistor.

An object of the present invention is to provide an electronic ignition device that can reduce substantially variations of the current limiting value caused by temperature changes.

Another purpose of the present invention is to provide an electronic distribution ignition device that can suppress oscillation of the power transistor.

SUMMARY OF THE INVENTION

These and other objects and advantages are achieved according to the invention by a series connection of two zener diodes between the base of the switching power transistor and ground, with the cathode of the first zener diode facing towards the minus (−) side and the cathode of the second zener diode face towards the plus (+) side. (That is, the two diodes are arranged with opposite polarities.)

The use of a zener diode as a current control circuit compensates for thermally induced changes in the $V_{BE}$ of the power transistor and the emitter resistor, so that variation of the current limiting value is limited to 5% or so at a temperature change of 100° C. In addition, because the arrangement is formed as an open loop control circuit, power transistor oscillation is also prevented, and no phase controlling condenser is needed for the circuit.

The operation of the electronic distributor ignition device according to the invention is as follows: The power transistor is turned on when an ignition signal is entered to the base of the power transistor from the engine controller according to the engine's running status at that time. A small current then begins to flow into the primary coil of the ignition coil. At the same time, the voltage drop across the emitter resistor of the power transistor increases continuously until the sum of the emitter resistor voltage drop and the power transistor $V_{BE}$ equals the sum of the forward voltage and the zener voltage of the two oppositely poled zener diodes connected in series between the base and ground of the power transistor. At this point, the power transistor base current is extracted to limit the current.

The voltage $V_{BE}$, the resistance of the emitter resistor, the forward voltage, and the zener voltage each has its own temperature coefficient. However, because the sum of the temperature coefficients of both the forward voltage and the zener voltage can be made to closely approximate the temperature coefficient of the sum of the $V_{BE}$ and the emitter voltage, it is possible to reduce variations of the current limiting value caused by changes of temperature.

In addition, since feedback control is adopted for the conventional current limiter, the power transistor oscillates when the output gain for the feedback control system input exceeds unity and the phase shifts 180°. In the present invention, however, no feedback control is used, and thus no oscillation occurs in the power transistor.

Other objects, advantages and novel features of the present invention will become apparent from the following detailed description of the invention when considered in conjunction with the accompanying drawings.

DETAILED DESCRIPTION OF THE DRAWINGS

Figure 1:
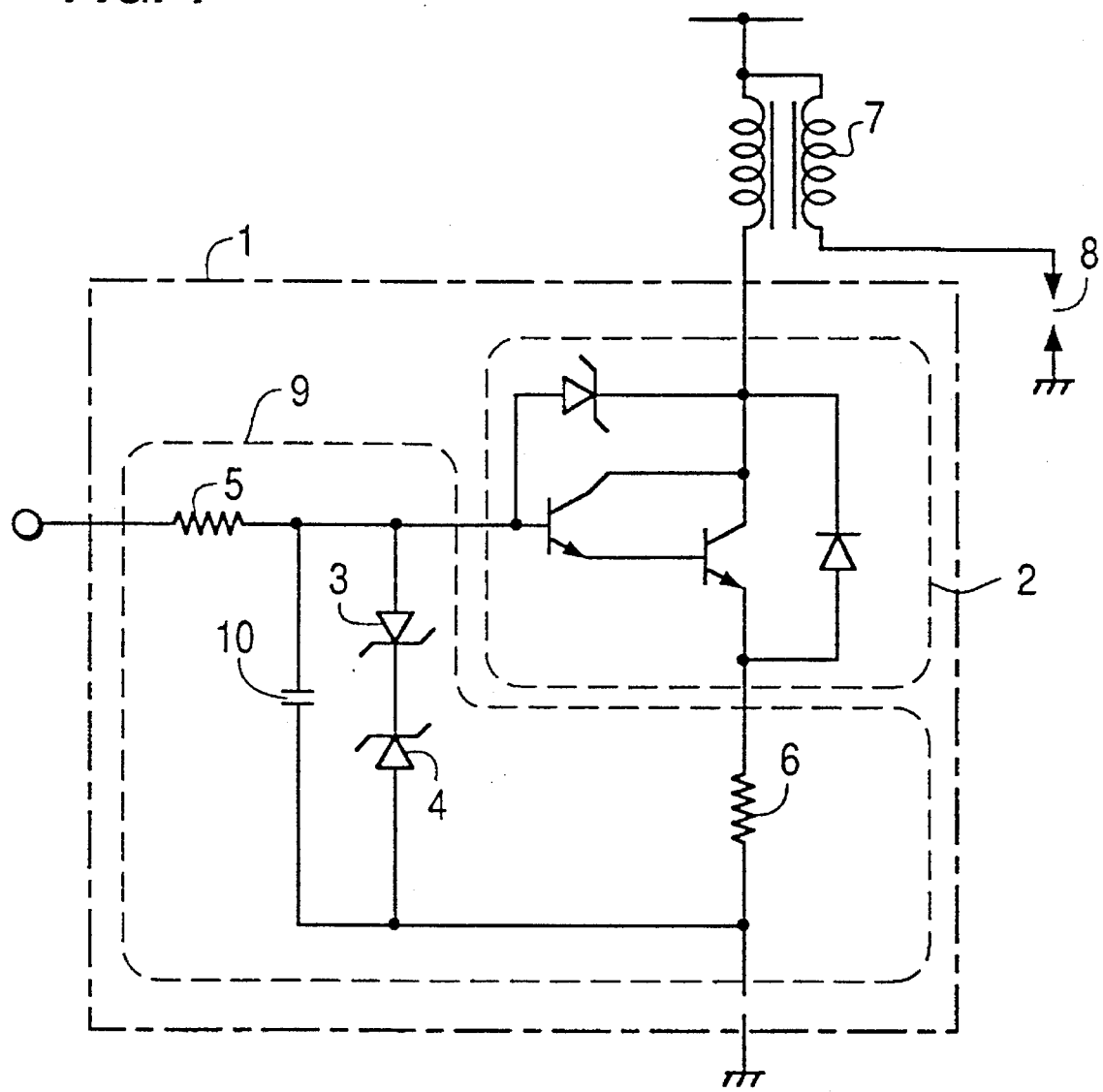
FIG. 1 is a circuit diagram of an electronic distributor ignition device according to the invention.

FIG. 1 shows a circuit diagram of a first embodiment of an electronic distribution ignition device according to the present invention. The ignition device 1 consists of a power transistor circuit 2 and a current control circuit 9 formed on a hybrid IC. The current control circuit 9 consists of a printed emitter resistor 6 connected between the emitter of the power transistor 2 and ground, zener diodes 3 and 4 used to extract the base current of the power transistor 2, an input resistor 5, and a surge absorbing condenser 10. The zener diodes 3 and 4 are connected in series, and are oppositely poled.

The power transistor 2 is turned on when an ignition signal is entered to its base through the input resistor 5 from an engine controller (usually a microcomputer, not shown) according to the engine's running status. At this point, a small current begins to flow from the power supply into the primary coil of the ignition coil 7, through the collector and the emitter of the power transistor 2, the emitter resistor 6, to ground. As this current increases, the voltage drop across the emitter resistor 6 increases, until the sum of the voltage $V_E$ across the emitter resistor 6 and the $V_{BE}$ of the power transistor circuit 2 equals the sum of the forward voltage $V_F$ of the zener diode 3 and the zener voltage $V_Z$ of the zener diode 4. The base current of the power transistor is then extracted to ground through the two zener diodes 3 and 4, limiting the current.

In this case, each of quantities $V_{BE}$, $V_E$, $V_F$, and $V_Z$ has its own temperature coefficient. In the embodiment of FIG. 1, the temperature coefficient for the sum of $V_F$ and $V_Z$ can be made to closely approximate the temperature coefficient for the sum of $V_{BE}$ and $V_E$. In this manner, it is possible to reduce the fluctuation of the current limiting value caused by temperature changes. In order to compare the temperature characteristic of the current limiting value of this embodiment of the invention with that of the conventional electronic distributor ignition device a brief explanation of FIG. 2 is necessary.

Figure 2:
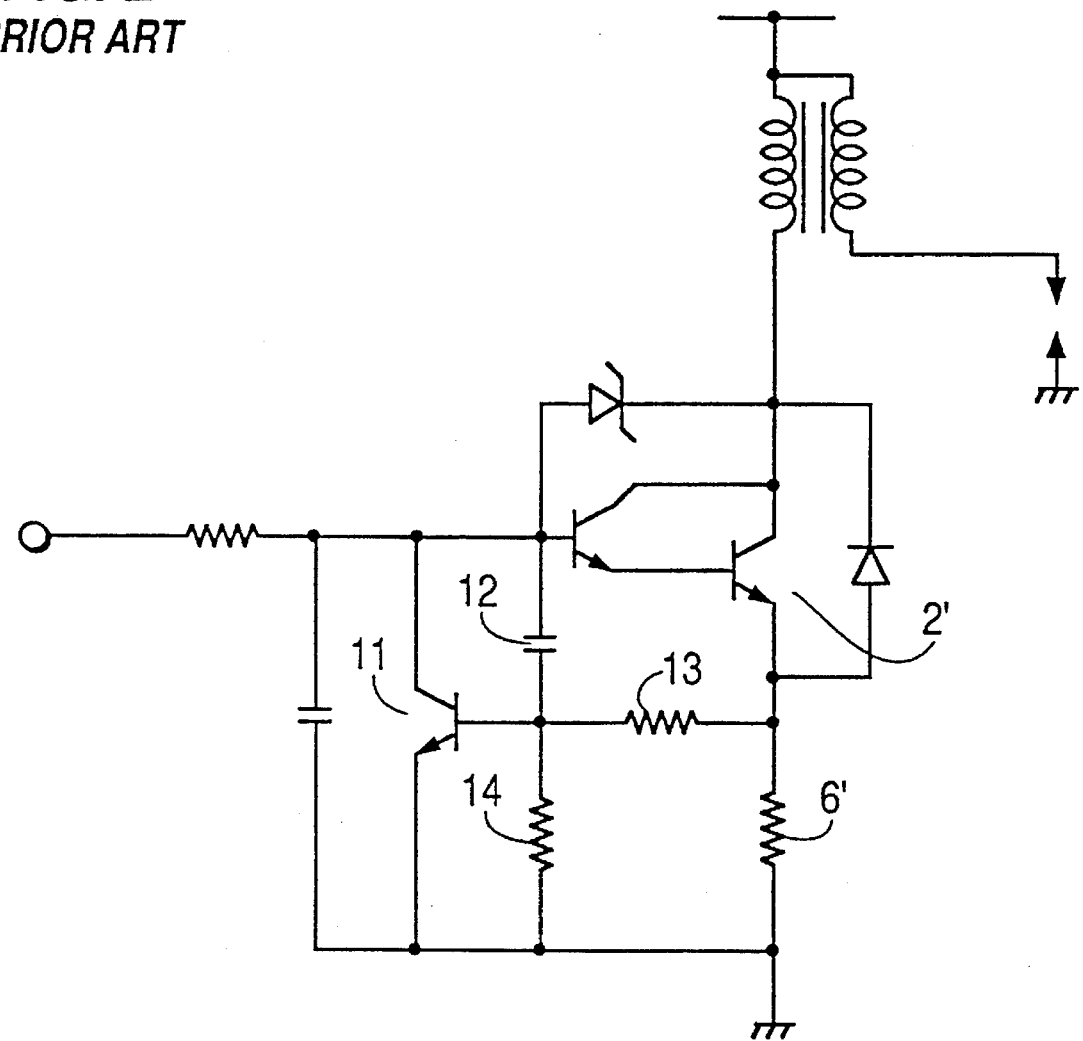
FIG. 2 is a circuit diagram of a conventional electronic distributor ignition device according to the prior art.

The temperature characteristic of the conventional circuit shown in FIG. 2 is determined primarily by the temperature coefficient of the $V_{BE}$ of the current limiting transistor 11, and that of the emitter resistor 6'. Since about $-2$ mV/° C. and Ag—Pd paste are often used as the $V_{BE}$ temperature coefficient and the emitter resistor respectively, they are also used in this application example. The result (temperature characteristic of the conventional circuit shown in FIG. 2) is about 1000 ppm/° C. If $I_{CL}$ is assumed as the current limiting value, the result will be as follows:

$$I_{CL} = \frac{V_E}{R6[1+0.001(T-25)]} \quad \text{Equation 1}$$

$V_E$: About 1.0 V at room temperature (25° C.)

$V_{BE}$: About 0.7 V at room temperature (25° C.)

$$V_E = [1+R_{13}/R_{14}][V_{BE}-0.002(T-25)] \quad \text{Equation 2}$$

$$R_{13}/R_{14} = 3/7 \quad \text{Equation 3}$$

If $I_{CL}$ is assumed to be 7.0 at room temperature, the result will be as follows:

$$I_{CL} = \frac{[1+R_{13}/R_{14}][V_{BE}-0.002(T-25)]}{R6[1+0.001(T-25)]} \quad \text{Equation 4}$$
$$= \frac{10[0.7-0.002(T-25)]}{7R_6[1+0.001(T-25)]}$$

Thus, $I_{CL}$ becomes 7.0 A at 25° C. and 4.4 A at 130° C., and the $I_{CL}$ temperature coefficient becomes about 3700 ppm/° C. This is the temperature coefficient for the conventional circuit.

The temperature characteristic of the embodiment of the invention shown in FIG. 1 is determined by the temperature coefficients of the voltage $V_{BE}$ of the power transistor 2', the resistance of the emitter resistor 6, the voltage $V_F$ of the zener diode 3, and the voltage $V_Z$ of the zener diode 4. The $V_{BE}$ temperature coefficient is about $-3$ mV/° C., the R6 temperature coefficient is about 1000 ppm/° C., and if the current to be extracted when the current is limited is about 20 mA, the sum of the temperature coefficients of $V_F$ and $V_Z$, will be about $-1.5$ mV/° C. when $V_Z$ is 2.0 V. If ICL is assumed as the current limiting value, the result will be as follows:

$$I_{CL} = \frac{[V_F+V_Z-0.0015(T-25)]-[V_{BE}-0.003(T-25)]}{R6[1+0.001(T-25)]} \quad \text{Equation 5}$$

Since $V_{BE}$ is set to about 1.5 V, $V_F$ to about 0.7 V, and $V_E$ to about 1.0 V, a value of 2.0 V should be used for $V_Z$. $V_E$ will be as shown below.

$$V_E = 2+0.7-1.5 = 1.2 \text{ V} \quad \text{Equation 6}$$

If $I_{CL}$ is assumed to be 7.0 A at room temperature:

$$R_6 = 1.2/7 = 171 \text{ m}\Omega \quad \text{Equation 7}$$

As a result, $I_{CL}$ will be 7.0 A at 25° C. and 7.2 A at 130° C. and the $I_{CL}$ temperature coefficient will be about 300 ppm/° C. Thus, the invention will be found to be far better than the prior art in this regard.

Figure 3:
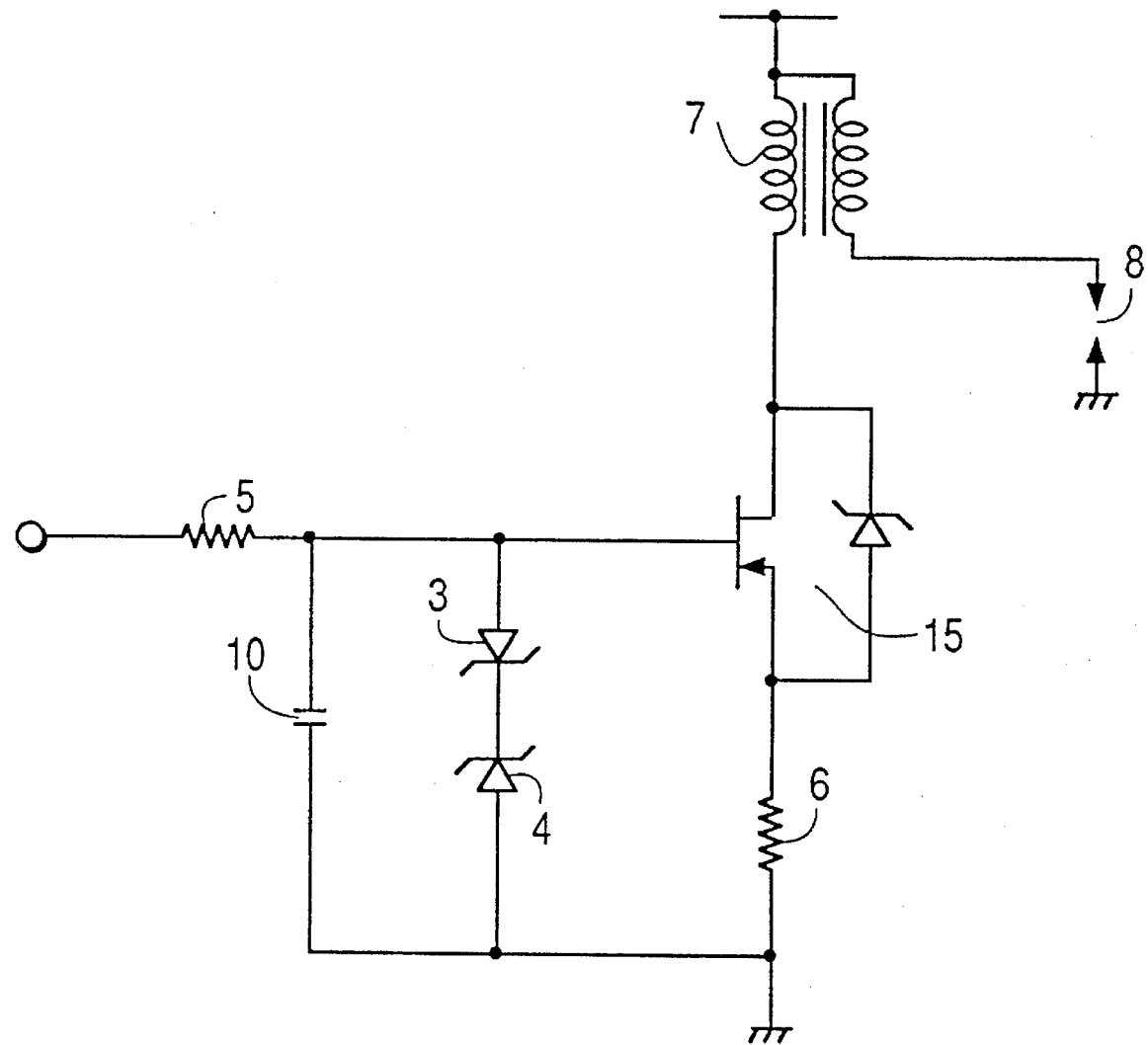
FIG. 3 is a circuit diagram of another embodiment of the invention in which a MOS/FET is used as the power switching element.

FIG. 3 is a circuit diagram of a second embodiment of distributor ignition device according to the invention. In this example, unlike the first, a MOS/FET 15 is used as the power switching element. However, as in the first example, two oppositely poled zener diodes 3 and 4 are connected serially between the gate of the MOS/FET 15 and ground. The operation of the embodiment of FIG. 3 is the same as that of FIG. 1.

Figure 4:
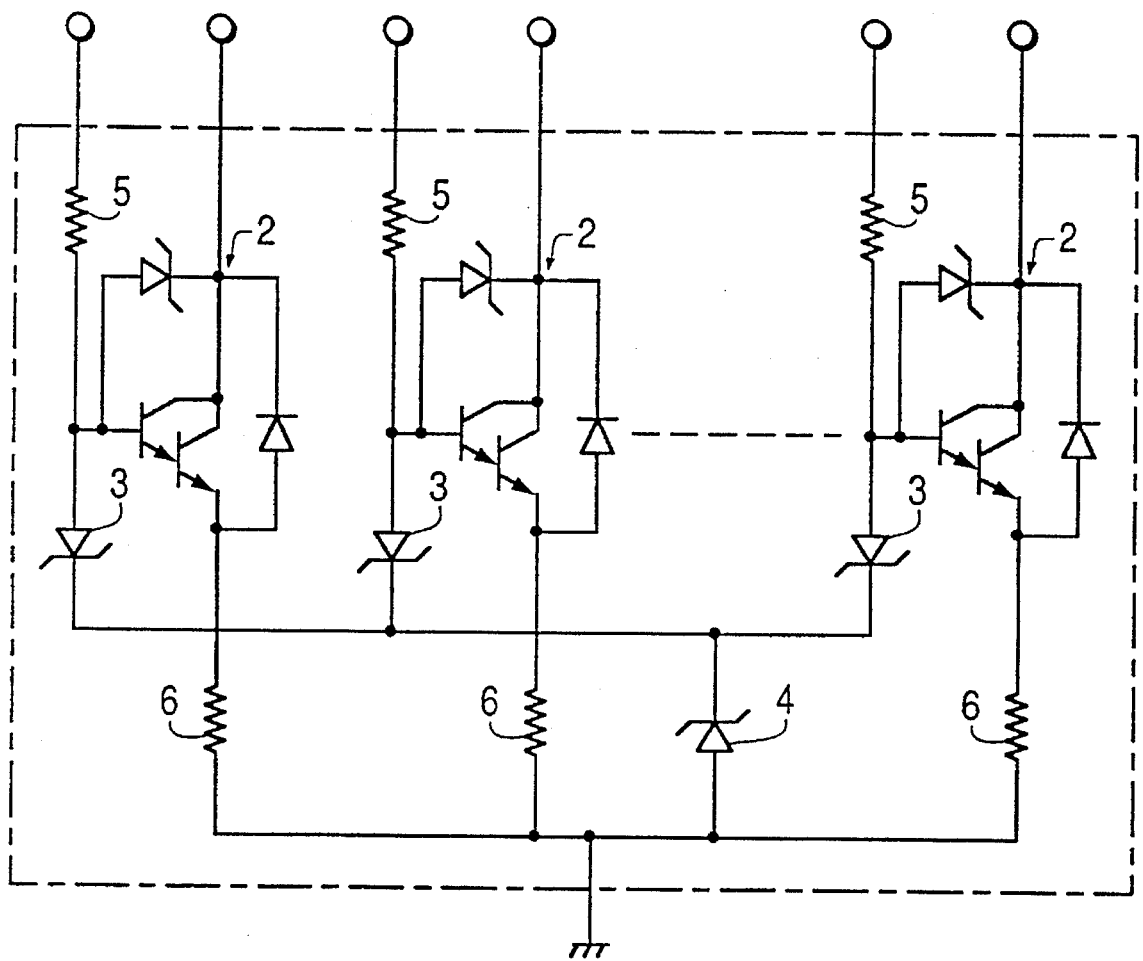
FIGS. 4 through 7 are circuit diagrams of further embodiments of the invention.

FIG. 4 shows the circuit of a third embodiment of the invention in which, as in the first embodiment, a power transistor is used as the power switching element. Multiple switching elements 2 are set in parallel in a single ignition device, with the cathodes of the respective zener diodes 3 connected at a node to which a zener diode 4 is connected in the opposite direction of the zener diode 3. The anode of zener diode 4 is connected to ground. (The ignition coil and the ignition plug are not shown.) When a switching element is to be set for each cylinder of an internal combustion engine, the connection should be made as shown in FIG. 4, so that the zener diode 4 can be used commonly.

Figure 5:
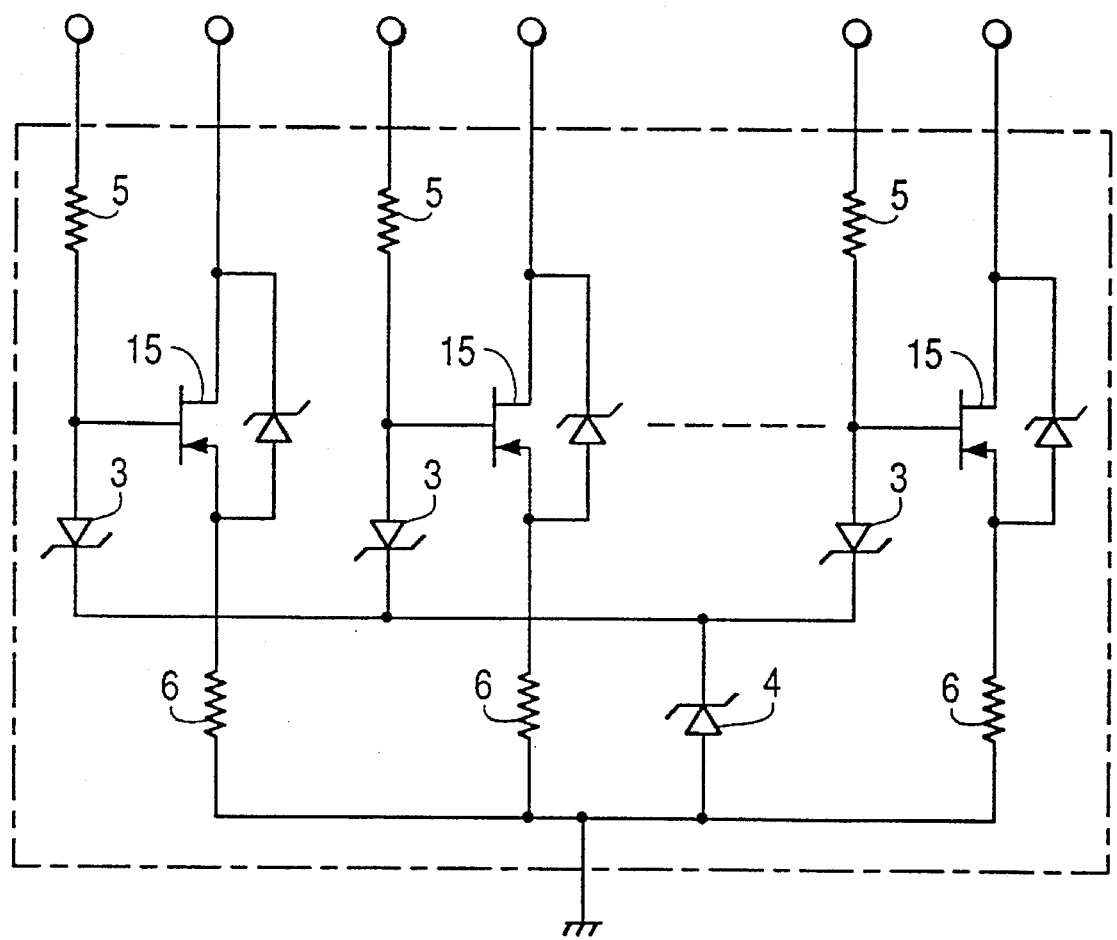

FIG. 5 shows the circuit of an electronic distributor ignition device related to the fourth embodiment of the invention, in which a MOS/FET is used as a power switching element. As in FIG. 4, multiple switching elements are arranged in parallel, with the zener diodes 3 connected to ground by a single zener diode 4.

Figure 6:
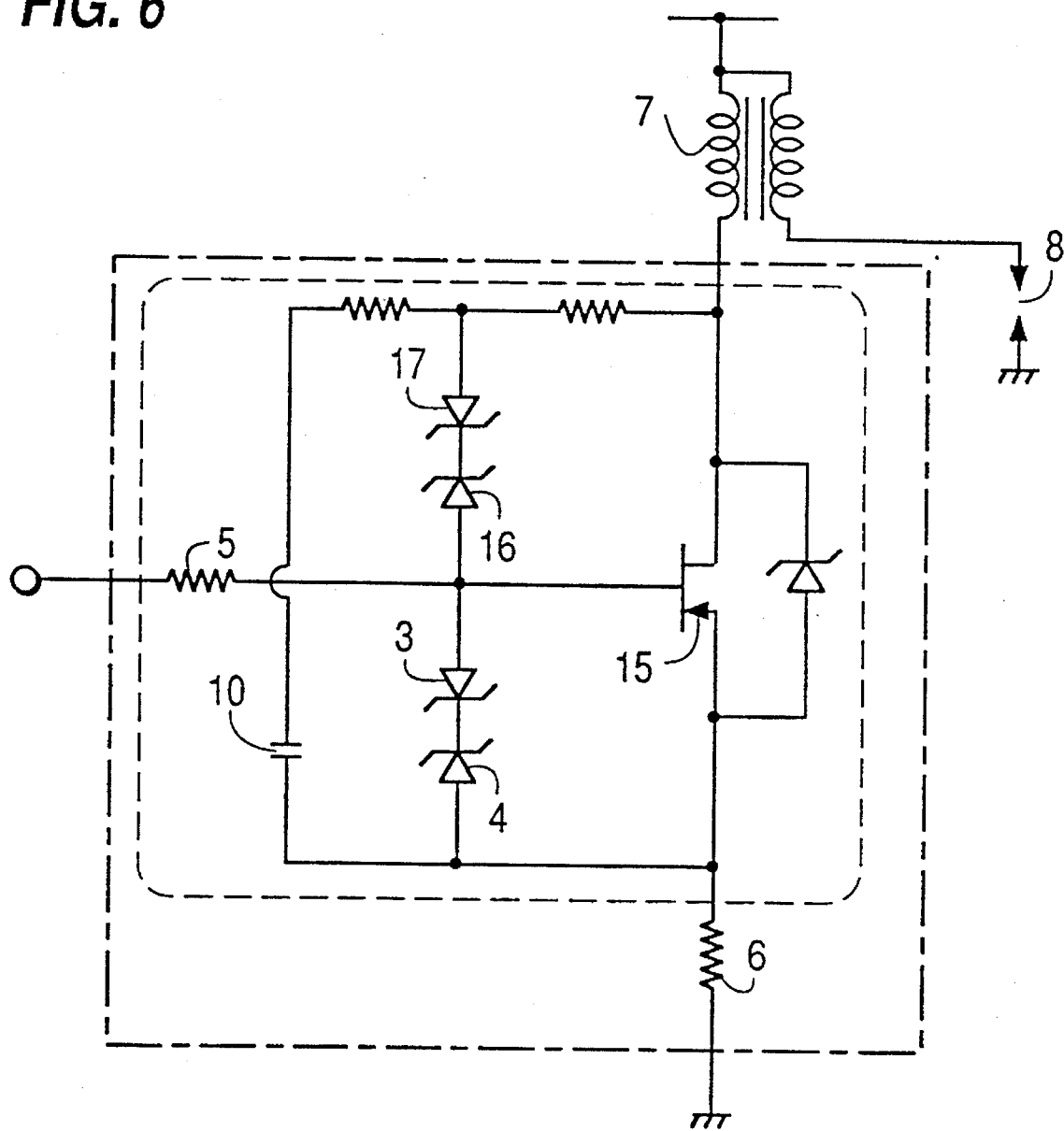

FIG. 6 shows a circuit diagram of an electronic distributor ignition device related to the fifth embodiment of the invention. In this example, a power MOS/FET is used as the power switching element, and oppositely poled zener diodes 3 and 4 are connected in series between the gate and source of the MOS/FET 15 as a current control circuit. Furthermore, a primary voltage control circuit can be mounted on the power MOS/FET chip, in the form of oppositely poled zener diodes 16, 17, which are connected in series between the gate and the drain of the MOS/FET. A resistor or a zener diode can be formed using polysilicone on the power MOS/FET chip in a manner well known to the art.

Figure 7:
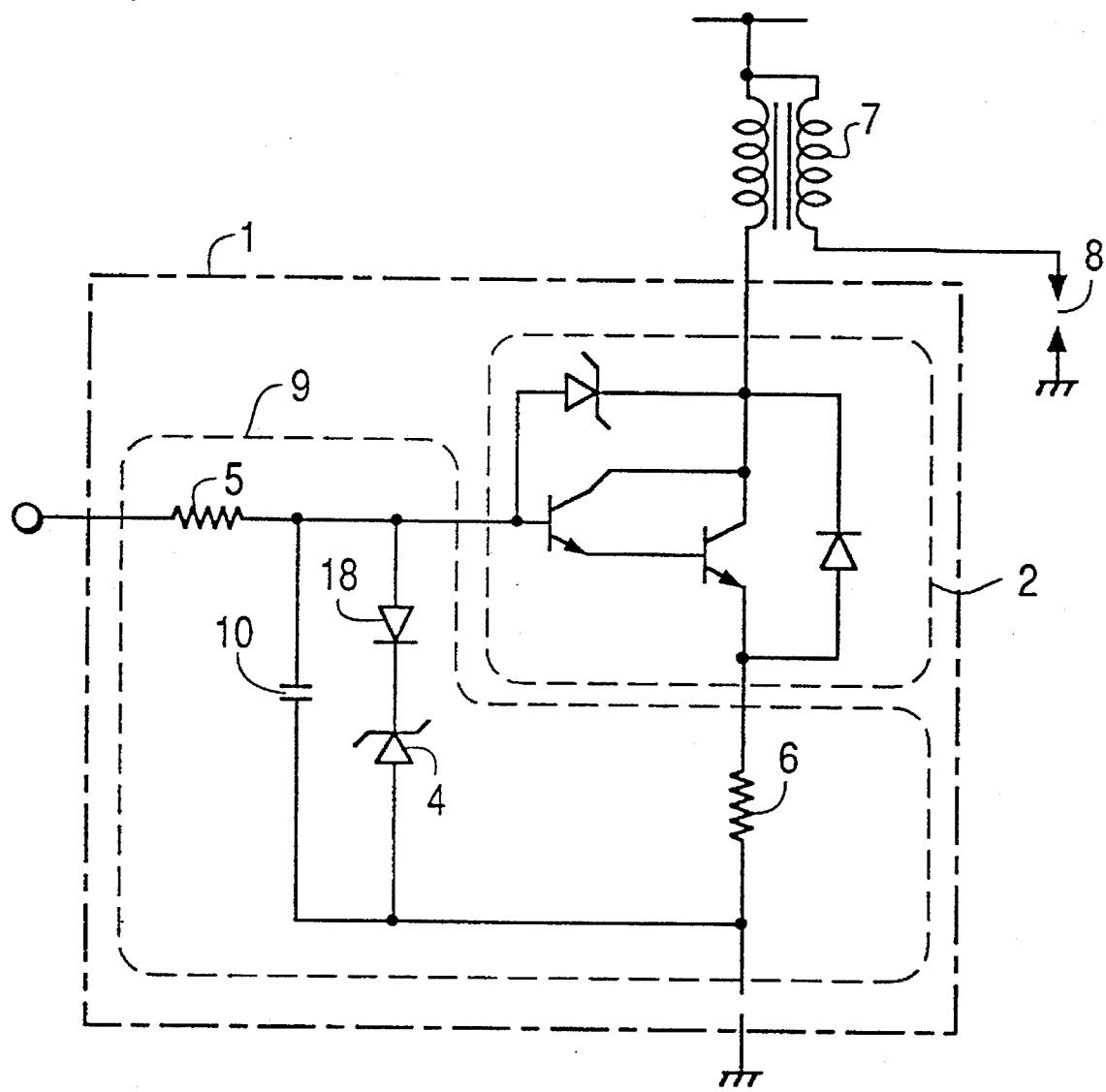

FIG. 7 shows yet another embodiment of the invention in which a conventional diode 18 is substituted for the zener diode 3 of FIG. 1. Since the zener diode 3 (FIG. 1) functions essentially in the manner of a conventional diode in the embodiment of FIG. 1, this change does not affect the operation of the apparatus. A similar modification can be made in the other embodiments as well, in an analogous manner.

The invention prevents the current limiting value from dropping excessively at high operating temperatures, so the ignition coil output secondary voltage drops less, maintaining good performance of the internal combustion engine.

In addition, since the current limiting value drops less, the heat output of the power switching element can be reduced, making it possible to use the ignition device in higher temperatures.

The adoption of open loop control in this invention also eliminates oscillations in the power transistor, so that the phase control oscillation-preventive condenser utilized in the conventional ignition device is unnecessary, or the limiting range of the power transistor $h_{FE}$ and the ignition coil inductance can be expanded.

Although the invention has been described and illustrated in detail, it is to be clearly understood that the same is by way of illustration and example, and is not to be taken by way of limitation. The spirit and scope of the present invention are to be limited only by the terms of the appended claims.

We claim:

1. Temperature compensating switching arrangement for an electronic switch circuit in an electronic distributor ignition device, comprising:

a switch circuit having a current path for interruptibly conducting an electric current between first and second terminals thereof, said switch circuit having a first state in which said current path is conductive and a second state in which said current path is not conductive; said switch circuit further having a control input which causes said current path to be in said conductive state whenever a threshold current is supplied to said control input; and said switch circuit further having a temperature coefficient;

at least one of said terminals of said switch circuit being coupled to a source of fixed potential by means of a current limiting resistance, which also has a temperature coefficient;

a control current extraction circuit connected between said control input and said source of fixed potential, said control current extraction circuit becoming conductive when a voltage applied to it exceeds a breakdown value; and wherein a temperature coefficient of said control current extraction circuit has a value which is approximately equal to the temperature coefficient of said switch circuit and said current limiting resistance.

2. Switching arrangement according to claim 1 wherein said control current extraction circuit comprises first and second oppositely poled diodes connected in series, at least one said diodes being a semiconductor breakdown diode.

3. Switching arrangement according to claim 1, wherein said source of fixed potential is ground.

4. Switching arrangement according to claim 1, wherein said control current extraction circuit comprises a series connection of oppositely poled semiconductor breakdown diodes.

5. Switching arrangement according to claim 1, wherein said control current extraction circuit comprises a series connection a diode and a semiconductor breakdown diode, said diode and semiconductor breakdown diode being connected with opposing polarities.

6. Switching arrangement according to claim 1, wherein said switch circuit comprises a power transistor.

7. Switching arrangement according to claim 1, wherein said switch circuit comprises a MOS/FET.

8. Switching arrangement according to claim 1, wherein said control current extraction circuit has applied thereto a voltage which is a function of current flowing in said current path.

9. Switching arrangement according to claim 1, wherein said control current extraction circuit is coupled in parallel with said current limiting resistor.

10. Switching arrangement for an electronic distributor ignition device, said arrangement having a temperature compensating circuit and comprising:

a switching power transistor circuit having an emitter and a collector, and a base for controlling a flow of current between said emitter and said collector; and a control current extraction circuit comprising a pair of oppositely poled diodes connected in series between said base and ground, at least one of said diodes being a semiconductor breakdown diode;

wherein said emitter of said switching power transistor is coupled to a fixed potential by means of a current limiting resistance; and wherein a temperature coefficient of said control current extraction circuit has a value which is approximately equal to the temperature coefficient of said switching power transistor circuit and said current limiting resistance.

11. Switching arrangement according to claim 10, wherein said fixed potential is ground.

12. Switching arrangement according to claim 10, wherein said pair of oppositely poled diodes have applied thereto a voltage which is indicative of magnitude of said current flow between said emitter and said collector of said switching power transistor circuit.

13. Switching arrangement according to claim 12, wherein said control current extraction circuit is coupled in parallel with said current limiting resistor.

14. Temperature compensating switching arrangement for an electronic switching circuit in an electronic distributor ignition device comprising:

a switching metal oxide semiconductor field effect transistor circuit having an interruptible current conducting path between first and second terminals thereof, and a gate input for controlling a flow of current in said current path, said transistor circuit further having a temperature coefficient;

at least one terminal of said switch circuit being coupled to a source of fixed potential by means of a current limiting resistance which also has a temperature coefficient; and a control current extraction circuit comprising a pair of oppositely poled diodes connected in series between said gate input and said source of fixed potential, at least one of said diodes being a semiconductor breakdown diode, whereby said control current extraction circuit becomes conductive when a voltage applied to it exceeds a breakdown voltage;

wherein a temperature coefficient of said pair of oppositely poled diodes has a value which is approximately equal to the temperature coefficient of said switching metal oxide semiconductor field effect transistor circuit and said current limiting resistor.

15. Switching arrangement according to claim 14, further comprising a primary voltage control circuit connected between the gate input and a drain of said metal oxide semiconductor field effect transistor circuit.

16. Switching arrangement according to claim 15, wherein said primary voltage control circuit comprises a series connection of at least two oppositely poled diodes, at least one of which is a semiconductor breakdown diode.

17. Switching arrangement according to claim 14, wherein said pair of oppositely poled diodes have applied thereto a voltage which indicative of magnitude of said current path between said emitter and said collector of said switching power transistor circuit.

18. Switching arrangement according to claim 17, wherein said pair of oppositely poled diodes is coupled in parallel with said current limiting resistor.

19. Switching arrangement for an electronic distributor ignition device, said arrangement having a temperature compensation circuit and comprising:

a plurality of switch circuits, each having a current path for interruptibly conducting an electric current between first and second terminals thereof, each of said switch circuits having a first state in which said current path is conductive and a second state in which said current path is not conductive; said switch circuit further having a control input which causes said current path to be in said conductive state whenever a threshold current is supplied to said control input; and each of said switch circuits further having a temperature coefficient;

at least one of said terminals of said switch circuits being coupled to a source of fixed potential by means of a current limiting resistance, which also has a temperature coefficient;

a plurality of first voltage limiting semiconductors, a separate one of such voltage limiting semiconductors being coupled between the control input of each of said switch circuits and a common connection point, all of said first voltage limiting semiconductors being connected with like polarity; and a second voltage limiting semiconductor connected between said common connection point and said source of fixed potential, said second voltage limiting semiconductor being connected with a polarity which is opposite that of said first voltage limiting semiconductors;

wherein a temperature coefficient of said first and second voltage limiting semiconductors has a value which is approximately equal to the temperature coefficient of said switch circuits.

20. Switching arrangement according to claim 19, wherein each of said switch circuits comprises a power transistor circuit.

21. Switching arrangement according to claim 20, wherein said voltage limiting semiconductors are zener diodes.

22. Switching arrangement according to claim 19, wherein each of said switch circuits comprises a MOS/FET.

23. Temperature compensating switching arrangement for an electrical switch circuit in an electronic distributor ignition device, comprising:

a switch circuit having a current path for interruptibly conducting an electric current between first and second terminals thereof, said switch circuit having a first state in which said current path is conductive and a second state in which said current path is not conductive; said switch circuit further having a control input which causes said current path to be in said conductive state whenever a threshold current is supplied to said control input; and said switch circuit further having a temperature characteristic;

at least one of said terminals of said switch circuit being coupled to a source of fixed potential by means of a current limiting resistance, which also has a temperature coefficient;

a control current extraction circuit connected between said control input and a current sink, said control current extraction circuit comprising a series connection of first and second oppositely poled voltage limiting semiconductors, whereby said control input is connected to said current sink when a voltage applied to said control current extraction circuit exceeds a breakdown value; and said control current extraction circuit having a temperature coefficient which is approximately equal to the temperature coefficient of said switch circuit and said current limiting resistance.

\* \* \* \* \*